United States Patent [19]

Moore

[11] 4,330,720
[45] May 18, 1982

[54] ELECTROGRAPHIC RECORDING APPARATUS EMPLOYING AN IMPROVED DRIVE CIRCUIT

[75] Inventor: Chad Z. Moore, Brecksville, Ohio
[73] Assignee: Gould Inc., Rolling Meadows, Ill.
[21] Appl. No.: 118,278
[22] Filed: Feb. 4, 1980

Related U.S. Application Data

[62] Division of Ser. No. 963,404, Nov. 24, 1978, Pat. No. 4,215,355.

[51] Int. Cl.³ .............................................. H03K 3/01
[52] U.S. Cl. .................................. 307/270; 307/246; 307/592; 307/597
[58] Field of Search ................ 307/246, 270, 592, 597

[56] References Cited

U.S. PATENT DOCUMENTS

| | | | |
|---|---|---|---|
| 3,119,027 | 1/1964 | Faust | 307/592 |
| 3,543,091 | 11/1970 | Marek | 307/592 |
| 3,792,495 | 2/1974 | Bliss et al. | 346/155 |
| 3,974,403 | 8/1976 | Georgopoulos | 307/246 |
| 4,030,107 | 6/1977 | Tagawa | 346/155 |
| 4,054,885 | 10/1977 | Rothgordt | 346/154 |

Primary Examiner—Stanley D. Miller, Jr.
Assistant Examiner—B. P. Davis
Attorney, Agent, or Firm—Edward E. Sachs; John R. Garrett

[57] ABSTRACT

In accordance with the present invention there is provided an electrographic recording apparatus for recording on an electrostatic charge retentive record medium and a driver circuit suitable for use therein. The apparatus comprises a plurality of recording electrodes mounted in close proximity to the record medium. A plurality of complementary electrodes are mounted in electrical cooperative relationship with the recording electrodes. Improved driver circuits are provided for applying a voltage to the electrodes. The driver comprises a current branch to which the electrode is connected. A current control is provided for supplying a current through the current branch, which current biases diodes to force the electrode to a reference potential. The current further charges an electrical storage element. To apply a high voltage to an electrode, the current control blocks the current flow. The potential stored in the storage element which causes a base-emitter current flow to forward bias the transistor. Forward biasing the transistor connects the electrode to a high voltage supply. When the current control again permits current flow, it causes the transistor to become reverse biased and forward biases the diodes to force the electrode to return to the reference potential.

Another aspect of the present invention is an improved control circuit for the electrodes. The control circuit includes an assembly memory for assembling parts of a line of data, an image memory for controlling recording electrodes and a transfer system for transferring assembled data from the assembly memory to the write memory. Also included is a transfer/assembly control for alternately causing the contemporaneous assembly of one line of data and reading out the preceding line of data to the recording electrodes and causing the transfer of data between the assembly and write memories. Another aspect of the control circuit is an address generating system for addressing the image memory to address words of the stored data to the record electrodes and for actuating appropriate corresponding complementary electrodes.

10 Claims, 8 Drawing Figures

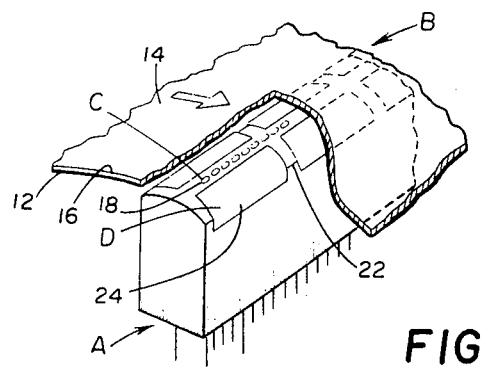
FIG.1
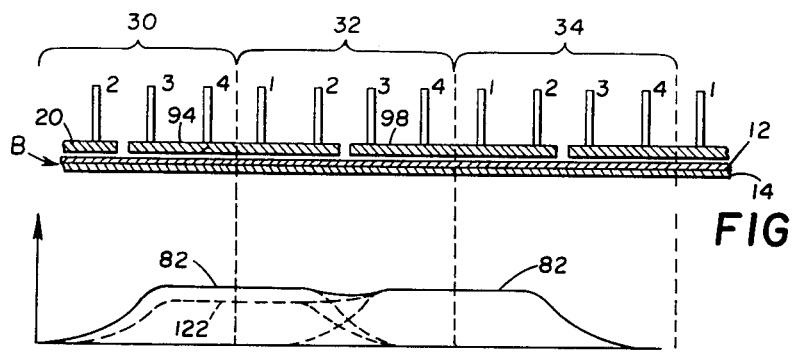
FIG.3a
FIG.3b
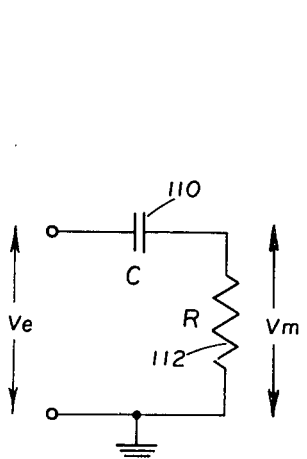
FIG.4
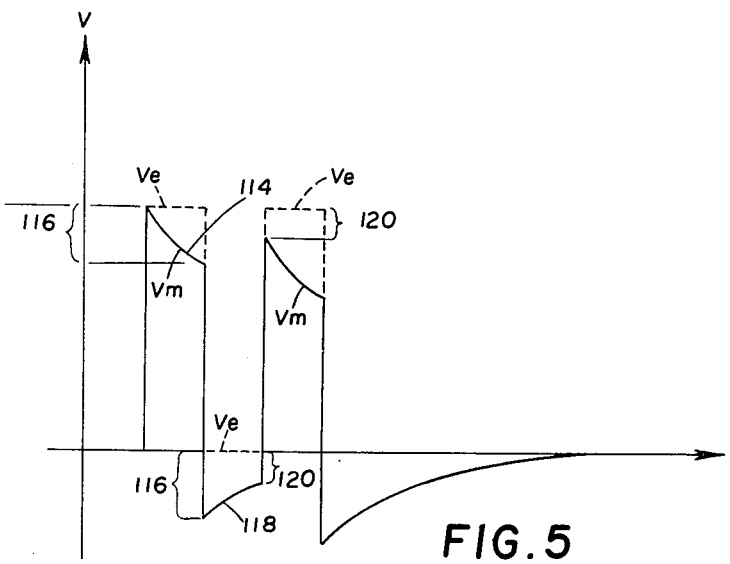
FIG.5

ELECTROGRAPHIC RECORDING APPARATUS EMPLOYING AN IMPROVED DRIVE CIRCUIT

This is a division, of application Ser. No. 963,404, filed Nov. 24, 1978, now U.S. Pat. No. 4,215,355, July 29, 1980.

BACKGROUND OF THE INVENTION

This application pertains to the art of electrographic recording systems and more particularly to an apparatus for forming electrostatic latent images on a record medium in accordance with information provided by electronic signals.

This invention is particularly applicable to high speed recorders such as peripheral equipment for computers, telecopy, and the like and will be described with particular reference thereto. It will be appreciated that the invention has broader aspects for recording alphanumeric, pictorial, and graphic data. It is amenable to receiving electronic signals in a raster format as would be used for producing a CRT or video display.

The electrographic recording process is generally characterized by two steps. The first step is the establishment of an electrostatic latent image on a record medium by electrically charging selected areas of the medium with electrostatic recording electrodes connected to charging circuit means. The second step is rendering the electrostatic latent image visible by toning or developing the charged areas on the record medium.

More specifically a special paper is passed over an image head which contains the electrostatic recording electrodes. A suitable paper for use as the record medium is described in U.S. Pat. No. 3,657,005 assigned to the same assignee as the present application. Generally, the image head consists of a generally linear assembly of needle-like recording electrodes or styli. Adjacent the assembly of recording electrodes is one or more assemblies of complementary electrodes or shoes. The latent image is formed on the record medium by applying a negative voltage to the recording electrodes and a positive voltage to the complementary electrodes. A potential difference between the recording and complementary electrodes of approximately 500 volts results in the deposit of a negative electrostatic charge on the record medium under a recording electrode. Suitable image heads are disclosed in U.S. Pat. Nos. 3,611,419 and 3,653,065 assigned to the same assignee as the present application.

Generally, the recording electrodes are charged with a voltage of a first polarity, for example −300 volts, and the complementary electrodes are charged with a voltage of the opposite polarity, for example +300 volts. When these two voltages are applied contemporaneously to a recording electrode and complementary electrode, a localized negative charge is deposited on a dielectric surface of the above special paper. If the two voltages are not applied contemporaneously the potential fails to achieve the amplitude required to deposit a charge on the above paper.

The principal that a recording electrode and adjacent complementary electrode must be actuated contemporaneously to establish a latent image allows for a reduction in the number of circuits necessary for actuating the recording and complementary electrodes. As shown in more detail, in U.S. Pat. No. 3,653,065, supra, the assembly of recording electrodes are divided into a number of arrays and the arrays divided into two groups of alternating arrays. In each group, like-numbered electrodes in each array are connected together. A plurality of complementary electrodes are similarly provided, specific complementary electrode(s) are mounted adjacent each array of recording electrodes. To form a latent image under one or more of the recording electrodes in a selected array, the selected recording electrodes of one group and the adjacent complementary electrodes to the selected array are actuated in coincidence. Actuating the selected recording electrode actuates like-numbered recording electrodes in every array in the group. However, if only the complementary electrodes adjacent to the selected array are actuated simultaneously, then a latent image is formed only under the selected recording electrodes.

To print a line of data, i.e. a set of electronic signals indicating whether an electrostatic charge is to be or not be deposited under each recording electrode, the system divides the line into segments. Each segment corresponds to one of the arrays of recording electrodes. The segments corresponding to the arrays are serially connected alternately to the first and second groups of arrays. Contemporaneously with the segment corresponding to the first array being connected thereto, the complementary electrodes adjacent the first array are actuated. The process continues similarly for the second, third, fourth, and subsequent arrays until the entire line of data has been recorded. The record medium advances slightly and the process is repeated for second and subsequent lines of data.

After the record medium has received the latent image, it advances to a development area in which toner is supplied to the surface. The toner includes black particles which adhere only to the charged areas of the surface. The excess toner is removed from the noncharged areas of the record medium and the toner fixed to the charged surface areas. The record medium then emerges from the recorder as a permanent, printed record.

One of the problems with this type of recorder is what is known as a striping effect. That is, the intensity of the toned electrostatic image produced by the recorder varies in a repeating pattern across the image head. The toned images vary from grey to black with a periodicity comparable to the array sizes. This resultant striping is undesirable.

One problem with the prior art recorders is in their ability to record with higher speeds demanded by new generations of data processing equipment.

Another problem with the prior art electrographic recording apparatus is in their relatively greater requirements for high voltage power.

The present invention contemplates a new and improved electrographic recording apparatus which overcomes the above referenced problems yet is simple and economical to manufacture.

SUMMARY OF THE INVENTION

In accordance with the present invention there is provided an electrographic recording apparatus for recording on an electrostatic charge retentive record medium and a driver circuit suitable for use therein. The apparatus comprises a plurality of recording electrodes mounted in close proximity to the record medium. A plurality of complementary electrodes are mounted in electrical cooperative relationship with the recording electrodes. Improved driver circuits are provided for applying a voltage to the electrodes. The driver comprises a current branch to which the electrode is connected. A current control is provided for supplying a current through the current branch, which current biases diodes to force the electrode to a reference potential. The current further charges an electrical storage element. To apply a voltage to an electrode, the current control blocks the current flow. The potential stored in the storage element then causes a base-emitter current flow in a transistor. This forward bias causes the transistor to turn on connecting the electrode to a high voltage supply. A diode becomes reverse biased and disconnects the circuitry from the reference potential source. When the current control again permits current flow, it causes the transistor to become biased off, forces the electrode back to the reference potential and forward biases the diodes to recharge the storage element.

Another aspect of the present invention is an improved control circuit for the electrodes. The control circuit includes an assembly memory for assembling parts or words of a line of data, an image memory for controlling recording electrodes and a transfer means for transferring assembled data from the assembly memory to the image memory. Also included is a transfer and assembly control for alternately allowing the simultaneous assembly of one line of data and imaging of the preceding line of data and causing the transfer of data between the assembly and image memories. Another aspect of the control means is an address generating means for addressing the image memory to readout words of the stored data to the recording electrodes and for addressing means actuating appropriate corresponding complementary electrodes.

Yet another aspect of the present invention is the above summarized driver for use in apparatus in which short duration high voltage pulses are applied to driven circuits.

One advantage of the present invention is higher potential recording speeds.

Another advantage of the driver of the present invention is lower power consumption.

Another advantage is greater safety to operators and freedom from injurious electrical shocks from inadvertent physical contact with the image head.

Yet another advantage of the driver of the present invention is greater reliability and shorter recovery times.

Other objects and advantages of the invention will appear from the following detailed description to be read in conjunction with the accompanying drawings.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof.

FIG. 1 is a perspective view of a portion of an image head for electrostatic recording adjacent to a record medium;

FIG. 3A is a sectional view through line A—A of FIG. 2;

FIG. 3B is a graphic illustration of electrical potentials on the conductive stratum of the record medium induced by the complementary electrodes in FIG. 3A;

FIG. 4 is an electrical equivalent circuit diagram depicting electrical relationships between electrodes and record medium;

FIG. 5 is a graphic illustration of electrical potentials across elements of FIG. 4;

DESCRIPTION OF THE PREFERRED EMBODIMENT

Figure 2:
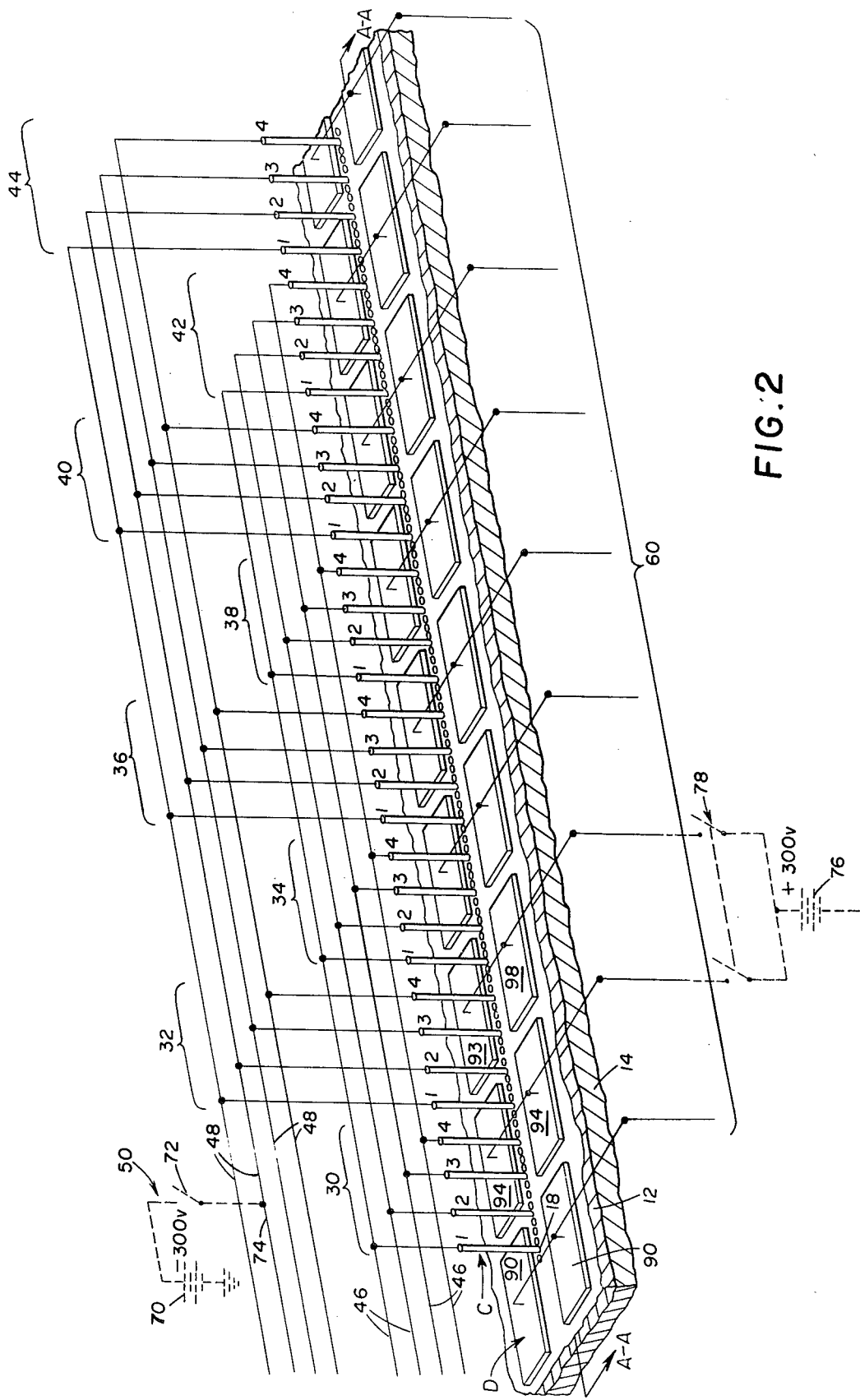
FIG. 2 is a diagrammatic representation of an image head similar to the head in FIG. 1.

Referring now to the drawings wherein the showings are for the purposes of illustrating the preferred embodiment of the invention only and not for purposes of limiting the same. FIGS. 1 and 2 show electrostatic charging means comprising an image head A in conjunction with a record medium B on which an image is to be recorded. The recording head comprises a multiplicity of recording electrodes or styli C and plurality of complementary electrodes or shoes D. The image head and in particular the recording electrodes and the complementary electrodes are connected with a control circuit E, note FIG. 6. The control circuit E includes receiving means F for receiving electronic data. The electronic data, for example, may be in the form of raster scan data tapped off from a video display. The control circuit further includes an image memory means G for holding a line of electronic data and a sequencing means H for addressing the memory means G and enabling actuation of selected recording electrodes and complementary electrodes. The sequencing means causes the recording electrodes to be enabled in such an order that recording electrodes do not attempt to induce an electrostatic image in a region of the record medium which has previously been subjected to a potential from a complementary electrode until the potential in such region has returned generally to a reference voltage. In the preferred embodiment, arrays of recording electrodes and the complementary electrodes in electrically cooperative relationship with the arrays are actuated in such a sequence that adjoining arrays are not actuated sequentially. In other words, no complementary electrode is twice actuated to apply a potential to the record medium without the intervening actuation of at least one other complementary electrode. This allows time for any potential on the record medium from the first actuation to dissipate.

The image head A is positioned adjacent a record medium feed path, such that the image head is adapted to be in close physical proximity to record medium B. The record medium B comprises a dielectric layer or stratum 12 combined with a conductive layer or stratum 14. In operation, the record medium is oriented so that an exposed charge retentive surface 16 of dielectric layer 12 substantially engages the surface of the charging means or image head A.

The image head A comprises a plurality of closely spaced recording electrodes arranged generally thereacross. The number of recording electrodes is preferably sufficient to span the width of the record medium as it passes the image head. Each recording electrode has a relatively small area 18 exposed and so positioned that it comes into close proximity with the record medium during a recording operation. The recording electrodes C are generally small, closely spaced electrical conductors embedded in a support 22 composed of a suitable dielectric material such as a plastic or a ceramic. The ends 18 of the recording electrodes are substantially flush with the surface of the support. By way of example, the recording electrodes can be approximately 10 mils in diameter and spaced on approximately 12.5 mil centers so that they are separated by about 2.5 mils. The recording electrodes C, as illustrated, are linearly arranged. However, they are adaptable to a variety of arrangements such as a generally linear arrangement in which the electrodes are staggered for closer compaction of the image produced, or they may be arranged in rectangular areas to generate alpha-numeric symbols, or the like. Generally the more closely the recording electrodes are arranged, the finer the resolution of the image becomes.

The complementary electrodes D are mounted in support 22 with surfaces 24 substantially flush with the surface of support 22. The recording electrodes C are mounted in support 22 with faces 18 substantially flush with the surface. Preferably the surface of the image head A is slightly curved so that the record medium may be arched against it during recording for firmer engagement. The complementary electrode means D are generally rectangularly shaped electrical conductors of much greater size than recording electrodes C. They are arranged in a parallel relationship with the recording electrode C centered between and parallel to pairs of complementary electrodes. The exposed surface of complementary electrodes D may, for example, be coated with a high permittivity dielectric such as barium titanate for protection against accidental shorting.

Looking to FIG. 2, the recording electrodes are divided into arrays 30, 32, 34, 36, 38, 40, 42 and 44. Each array contains a plurality of recording electrodes illustrated as 1, 2, 3 and 4. Like-numbered electrodes of alternate arrays, 30, 34, 38 and 42 are connected together by a first circuit means 46. Taken together arrays 30, 34, 38 and 42 form a first group of arrays. The arrays alternately arranged between the arrays of the first group, that is, arrays 32, 36, 40 and 44, similarly have like-numbered recording electrodes connected together by a second circuit means 48. Taken together arrays 32, 36, 40 and 44 form a second group of arrays. The first and second groups of arrays are electrically independent. It will further be appreciated that the number of arrays may vary and is in no way limited to the eight arrays shown for illustration. Normally, the number of arrays would exceed the eight illustrated in FIG. 2. Further, the number of recording electrodes in each of the arrays would normally far exceed the four shown for purposes of illustration. Nor is the number of groups of arrays limited to two. Rather three, four, or more groups of arrays may be used.

The complementary electrodes are arranged in electrically cooperative relationships with arrays of recording electrodes. In the preferred embodiment the row or recording electrodes is flanked by a row of complementary electrodes. Alternately, the charging means may comprise a row of a complementary electrodes positioned below a row or recording electrodes and positioned to pass on the opposite side of the record medium therefrom. Each complementary electrode consists of two electrically common elements such that recording electrodes are centered in a central area of the complementary electrode. Each complementary electrode is adjacent to only one array in each of the first and second groups of arrays. The complementary electrodes are separated from every other array of the same group by at least a part of an array of the other group.

Figure 6:
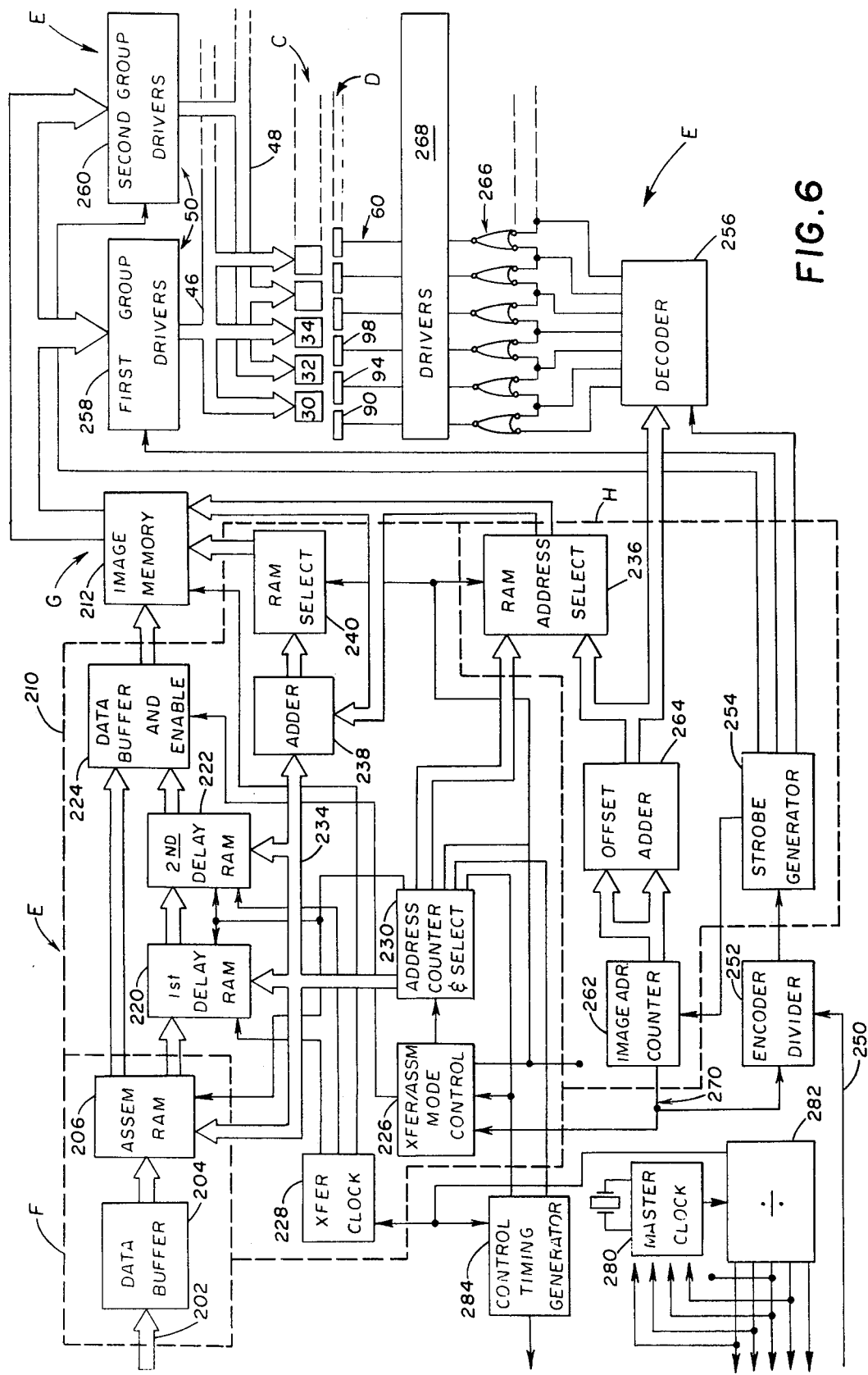
FIG. 6 is a block diagram of a control circuit for controlling the image head in FIG. 1.

The recording electrodes of the first and second groups are connected by circuit means 46 and 48, respectively with the control means E of FIG. 6. The control means includes a record electrode actuating means 50 for applying a voltage of a first polarity to selected recording electrodes alternately in each of the arrays of the first and second groups.

The complementary electrodes are connected by an electrical connection means 60 to the control means which is illustrated in detail in FIG. 6. The control means includes a complementary electrode actuating means for applying voltage of a second polarity to selected sets of complementary electrodes. Suitable voltages for application to the recording electrodes and the complementary electrodes are −300 volts for the recording electrodes and +300 volts for the complementary electrodes. Other voltages may, of course, be chosen. The potentials required to produce a latent electrostatic image vary with the nature of the record medium and the geometry of the recording and complementary electrodes. However, for the geometry and the record medium of the presently disclosed preferred embodiment, a voltage difference between the recording and complementary electrodes of over 500 volts has been found to be preferred. U.S. Pat. No. 3,611,419, supra, provides a more detailed description of electrical potential considerations, the disclosure of which patent is incorporated herein by reference.

For purposes of simply illustrating the invention, imagine a battery 70 having a −300 volt terminal connected to one side of a switch 72. Further, imagine that switch 72 is connected with one of the lines in either the first or second circuit means, for example a line 74. Further, imagine a second battery 76 having a +300 volt terminal connected with a double pole, single throw switch 78. Switch 78 is connected to the pair of complementary electrodes 94,98 flanking array 32. When it is desired to print a dot in the position corresponding to electrode number 2 in array 32, the control means causes switches 72 and 78 to close essentially simultaneously. Closing switch 72 causes the recording electrodes 2 of arrays 32, 36, 40 and 44 to be charged to −300 volts. Closing switch means 78 causes a momentary positive voltage distribution as illustrated by curve 82 in FIG. 3B to be induced on the conductive layer 14 of the record medium. Thus, the two potentials are coincident only beneath electrode 2 of array 32 causing there a total potential difference of 600 volts between recording electrode 2 of array 32 and the underlying region of the record medium. This potential difference is sufficient to form an electrostatic latent image on the record medium beneath face 18 of electrode 2 of array 32.

This technique of actuating all like-numbered recording electrodes in one of two groups of arrays and coincidently actuating complementary electrodes flanking an array in the one group is known as A-B phasing. U.S. Pat. No. 3,653,065, supra, provides a more detailed description of A-B phasing, the specification of which patent is incorporated herein by reference. In U.S. Pat. No. 3,653,065 the sequence of actuating recording arrays is alternately actuating like-numbered electrodes in the first and second groups; the sequence of actuating complementary electrodes, is actuating pairs of complementary electrodes of flanking the arrays serially, i.e. flanking array 30, then array 32, then array 34, etc.

In the serial actuation mode, complementary electrodes 90 and 94 are actuated coincidently with selected recording electrodes of the first group. This forms latent images under selected recording electrodes of the first array 30. In the next time period, selected recording electrodes of the second group are actuated coincident with complementary electrodes 94 and 98. This forms latent images under selected recording electrodes of second array 32. This sequence continues similarly along the entire image head. This sequence causes complementary electrode 94 to be twice actuated in a very short time interval. Similarly in each pair of actuated complementary electrodes, the one nearest the precedingly activated array is also twice actuated within a short time interval. This rapid sequential actuation of complementary electrodes is a cause of striping.

FIG. 4 shows an equivalent circuit for the complementary electrode and record medium. The voltage, $V_e$, applied to the complementary electrode is generally a square pulse as illustrated in FIG. 5. This pulse has an amplitude in the preferred embodiment of +300 volts and a time duration sufficient to allow coincident actuation of selected recording electrodes and charge transfer to the record medium therefrom. The complementary electrode along with the underlying conductive layer 14 of the record medium forms a capacitor 110. The plates of capacitor 110 are physically separated by the dielectric coating 12 and any air gap between the complementary electrode and the record medium. The conductive layer 14 of the record medium has an electrical resistance represented by a resistor 112. In the equivalent circuit, resistor 112 connects the capacitor 110 to ground. The potential applied to the conductive layer of the record medium is the voltage $V_m$ across resistor 112. When that complementary electrode actuating pulse $V_e$ is first applied the voltage $V_m$ is equal to the voltage $V_e$. Once the complementary electrode voltage pulse reaches its steady state level capacitor 110 charges exponentially through resistor 112 toward value $V_e$. This causes voltage $V_m$ to decay exponentially as illustrated at 114 in FIG. 5 while the potential across capacitor 110 increases. The rate of the decay is determined by the RC time constant of capacitor 110 and resistor 112.

At the end of an actuation cycle, the complementary electrode voltage is driven back to a reference level. This similarly drives the voltage $V_m$ down by the same amount. However, because the voltage on the conductive layer had decayed along curve 114, it is below $V_e$ by a voltage 116, the voltage drop across the capacitor. Accordingly, as the complementary electrode is driven back to the reference voltage, the voltage on the conductive layer 14 is driven below the reference voltage by voltage 116. Again this negative voltage 116 is conveyed through resistor 112 to ground and accordingly gradually decays along a curve 118. If sufficient time is allowed the referenced voltage will again be attained. However, if the complementary electrode is again actuated in very close time proximity, the potential on the conductive layer will still be below the reference by a potential 120. Accordingly, when the complementary electrode is again actuated with voltage $V_e$, conductive layer potential is increased by $V_e$. However, because the conductive layer potential started below the reference voltage by potential 120, the peak potential attained on the conductive layer is lower than in the preceding cycle by potential 120. Returning to FIG. 3B, when complementary electrodes 90 and 94 were first actuated a potential applied to the conductive layer was generally as illustrated by curve 82. However, when complementary electrodes 94 and 98 are actuated in very close time proximity, the conductive layer adjacent complementary electrode 94 achieves a lower potential than the first time by potential 120. The potential which the actuation of complementary electrodes applies to the conductive layer is illustrated by curve 122. Thus, the potential applied by the complementary electrodes for array 32 is less to the left side as illustrated in FIG. 3B than to the right. This lower potential reduces the static charge in the latent image which results in a lighter or more grey tone quality. Similarly, as each array is actuated the printing toward one side of the array will be more towards the light or grey region of tone quality whereas printing from the other side of the same array will have a darker or more black tone quality. These alternating regions cause the final printed image to have a striped appearance.

The invention contemplates solving the problem of the lower potential applied by the complementary electrodes to one side of each array in several ways. One way is to decrease the resistive value of the conductive layer to hasten the recovery rate to the reference potential of the effected region of the conductive layer. However, decreasing the resistive value of the conductive layer speeds the rate of voltage decay, hindering the reliability of image creation. Another alternative is to increase the time period between subsequent actuations of the same complementary electrode. This can be done by shortening the complementary electrode driving pulse, by lengthening the time between actuation pulses, or by using the non-sequential actuation method of the preferred embodiment herein.

Shortening the duration of the actuating pulse of the complementary electrodes creates problems in the overall reliability of the charge transfer between the recording electrode and the record medium. Lengthening the time between actuations slows the printing speed. A non-sequential actuation pattern which returns to reactivate a complementary electrode such as 94 in the above example after intervening actuations of complementary electrodes provides sufficient time for potential 120 to decay substantially to the reference potential.

When using the A-B phasing technique of alternating between arrays connected by first circuit means 46 and arrays interconnected by second circuit means 48, it is desirable to actuate every third array. In this manner, arrays in the first group are actuated then arrays in the second group, etc. A total of three passes through the arrays is required to actuate each array once. In the simplified image head shown in FIG. 2, the actuation sequence would be arrays 30, 36, 42, 32, 38, 44, 34, and 40. In this manner, no complementary electrode is actuated with two sequentially actuated arrays. Rather, each complementary electrode is given sufficient time to allow the conductive layer 14 to return to the reference potential between subsequent actuations. Other actuation sequences for the arrays may be used without departing from the present invention. For example, to print certain data in which it is known or determined that no image is to be printed in an affected region, the sequence need not allow time for that region to return to the reference level.

FIG. 6 is illustrative of circuitry for implementing the actuation sequencing of the preferred embodiment. It includes data receiving means F for receiving electronic data. The electronic data is described in terms of data lines which have one bit for each active recording electrode in the image head. The zero or unity value of each bit determines whether a corresponding recording electrode will be caused to deposit an electrostatic charge on the record medium. Each line of data may consist of one or more segments or words. The data receiving means includes a data bus 202 which normally has a smaller bit capability than the number of recording electrodes in an image head. Thus, each line of electronic data is received in several parts or words. For example, with an image head with 2176 recording electrodes an 8-bit data bus may be used. The 8-bit words, or bytes from the data bus are received by a data buffer 204 and entered into an assembly memory means such as a RAM 206. In the current example, an $272 \times 8$ RAM memory is used to store 2176 bits in 272 eight bit words. Assembly RAM 206 assembles the parts of the data line into a plurality of words of data.

After an entire line of data is assembled into assembly RAM 206, a transfer means 210 transfers the data from the assembly RAM 206 to image memory means G. The image memory means is, in the preferred embodiment, a RAM memory matrix 212. This RAM memory has storage in one word for as many bits as there are recording styli in the corresponding array, and has as many words as there are arrays. If the 2176 recording electrodes are arranged in 16 arrays of 136 electrodes each, a $16 \times 136$ RAM memory is used. To create a greater density of recording electrodes along the recording head, the recording electrodes may be arranged in an offset pattern. This offset in effect creates two rows very close together. However, a slight time lag is required between actuating these two rows to form a straight line across the moving record medium. To allow for this time lag, the transfer means includes a first and a second delay RAM 220 and 222 which receive some of the data bits from assembly RAM 206. A data buffer 224 receives the delayed bits from RAM 222 and the undelayed bits directly from assembly RAM 206. For example, in each 8-bit line the four even data bits may be transferred directly from assembly RAM 206 to data buffer 224 while the four odd data bits are delayed through the delay RAMs.

The transfer process is controlled by a transfer and assembly mode control 226 and timed and coordinated with a transfer clock 228. The transfer and assembly mode control 226 controls an address selector and counter 230. An address bus 234 conveys appropriate addresses from counter 230 to RAMs 206, 220 and 222 during the transfer process. The counter 230 indexes sequencing means H. The sequencing means includes an array address selection means 236 for addressing the appropriate 136-bit word of the image memory means. Because the image memory of the preferred embodiment is a 16 word $\times$ 136 bit RAM the 8-bit words from the assembly RAM must be reoriented. To select the appropriate locations in the image memory for the transferred words, a supplemental address means is required. This supplemental address means includes an ADDER 238 which receives the least significant 4-bits on the 8-bit address bus 234 and a 4-bit address from address selection means 236. ADDER 238 combines the two 4-bit address words and uses the sum to control a RAM selection means 240. RAM 240 provides the addresses necessary to fill the available 136-bit storage words of image memory G with the 8-bit words from assembly RAM 206 in the appropriate sequence.

The receiving and assembly of data written into assembly RAM 206 is independent from the reading of data from image memory means G for actuating selected recording electrodes. The assemble and image modes may be practiced simultaneously. The assemble and image mode may be practiced alternately with the transfer mode in which data is moved from the assembly RAM 206 to the image memory means G.

It is desirable to coordinate the timing for reading data from image memory means G to the recording electrodes with advancement of the record medium. Accordingly, after reading each line of data from image memory means G, the paper can be advanced an incremental distance. Alternately, after each incremental advancement of the record medium, the control means may be enabled to start the next image mode. Each time the record medium advances an incremental distance a signal is generated on line 250. This clocks an encoder divider means 252 which in turn enables a strobe generating means 254. The strobe generator sends out a series of pulses which enable alternately driver circuits for the first and second groups of arrays and which enable the complementary electrodes. In the preferred embodiment, the strobe generator generates a series of 12 microsecond pulses at about 16 microsecond intervals. Each pulse is strobed to a complementary electrode decoder 256 and alternate pulses are connected to recording electrode driver groups 258 and 260. Further, each strobe pulse increments an image address counter 262. The output of the counter is connected to an offset ADDER 264 which modifies the counter output so as to form addresses for the skip sequencing of actuating the complementary electrode assemblies. The offset ADDER 264 is connected to the image memory address selection means 236 which routes the ADDER addresses to select every third word in the image memory means G. Further the output of offset ADDER 264 is connected to decoder 256 which selects the appropriate pair of complementary electrodes for actuation. The decoder 256 is connected through a bank of OR gates 266 to a series of complementary electrode drivers 268.

At the completion of reading a line of data for imaging by the recording electrodes, counter 262 generates an end write signal on line 270. This signal resets encode divider 252 thus stopping strobe generator 254. Further, the signal on line 270 actuates transfer mode and assembly control 226 which stops the image mode and starts the transfer of data from assembly RAM 206 to image memory means G. At the end of the transfer mode control 226 starts the assemble mode during which a signal on line 250 can contemporaneously start an image mode.

Also illustrated in FIG. 6 is a master clock 280. This clock is connected to the divider means 282 which produces various clock signals for the control means and other parts of the recording apparatus. Divider 282 is connected to the transfer clock 228. Also connected to the divider means 282 is a control timing generator 284 which produces various system controls in conjunction with clock pulses and the address selector and counter means 230.

Figure 7:
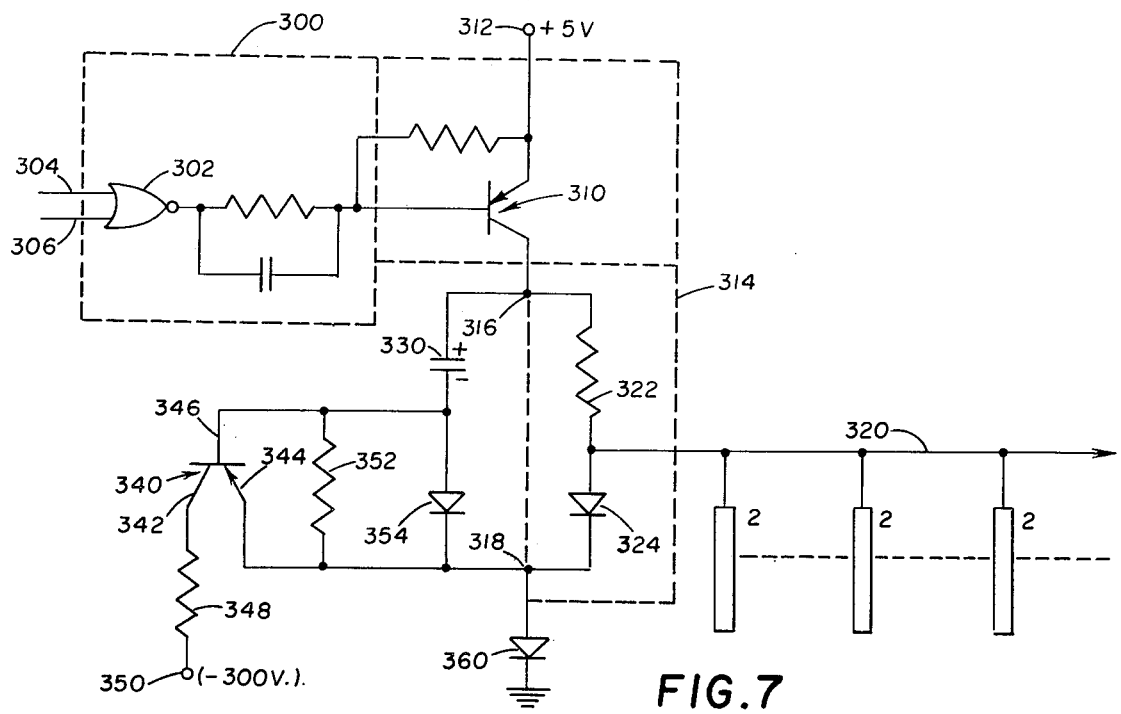
FIG. 7 is a circuit diagram of a recording electrode driver for use in conjunction with the block diagram of FIG. 6.

FIG. 7 illustrates one of the recording electrode driver circuits of recording electrode actuating means 50. The input to the driver circuit is received at a logic means 300. The logic means includes a NOR gate 302.

One input 304 receives data signals from the image memory means G and the other input 306 receives strobe signals from strobe generator 254. In the preferred embodiment these signals are negative or low and the NOR gate output high when an image is to be formed. The NOR gate may be a 7402 gate. When there is no recording operation to be carried out at least one of the inputs to NOR gate 302 is high and its output is low. A low output forward biases a transistor 310 and a high output reverse biases it.

Transistor 310 acts as a means for controlling current flow initiating at a low voltage supply 312 through a current branch 314. Transistor 310 may be a 2N6520 transistor. The low voltage supply 312 in the preferred embodiment is +5 volts. Current branch 314 has a first end 316 and a second end 318. Connected with current branch 314 is a driven circuit which includes means 320 for connecting the current branch with the driven circuit. The driven circuit in the preferred embodiment is the like-numbered recording electrodes in one of the groups of arrays. The connecting means 320 is connected with the first end 316 of the current branch with a resistive element 322 and with the second end 318 of the current branch with a diode 324, the connection of connecting means 320 to the current branch 314 forming an output end of the current branch 314. Resistive element 322 may be a 470 ohm resistor and diode 324 may be a 1N4148 diode.

Connected with the first end 316 of the current branch and with the current control means is a first end of an electrical storage means 330. In the preferred embodiment electrical storage means 330 is a 0.0047 mf capacitor.

An solid state switching means 340 is connected with a second end of storage means 330 and the second end 318 of the current branch. The switching means includes a first controlled lead 342, a second controlled lead 344, and a switch controlling means 346. In the preferred embodiment the switching means is a 2N6520 transistor, the first controlled lead the collector, the second controlled lead the emitter and the switch control means the base. The switch control means 346 is connected with the second end of electrical storage means 330. The second controlled lead is connected with the second end 318 of the current branch. The first controlled lead is connected through a limiting resistance 348 with a negative high voltage supply 350 such as −300 volts. Limiting resistor 348 is chosen of large magnitude to limit the current flow from the high voltage supply 350. For safety this current is limited to a sufficiently small amount that a person inadvertently touching the record electrodes is unlikely to be injured. A 2.7K resistor is preferred.

A biasing means 352 is connected between the base and emitter of the switching means 340. In the preferred embodiment the biasing means is a 4.7 Kohm resistor. The biasing means assures turnoff of transistor 340 under quiescent conditions and minimizes the effects of variation in its parameters. Connected in parallel with biasing means 352 is a diode means 354 such as a IN4007 diode.

The second end 318 of the current branch is connected to the reference voltage, ground, with a diode means 360 such as a UTR40 diode.

When the driver is not actuating the connected electrodes, one of the inputs on lines 304 and 306 is high. This causes the logic means to forward bias the current control means. Current flows from the positive low voltage supply 312 through current branch 314 and diode means 360 to ground. This forward biases diode means 324 and 360 which causes connecting means 320 to be essentially grounded. This ground potential is the reference level potential. As the current flows through the current branch, electrical storage means 330 quickly stores a potential generally equal to the potential across resistive means 322 and diode means 324. The potential at the base 346 is less negative than at the emitter 344. Thus, transistor 340 is biased off.

When it is desired to actuate one or more of the electrodes the inputs on lines 304 and 306 both go low. This causes logic means 300 to reverse bias current control means 310, thus prohibiting current flow therethrough. The stored electrical potential in electrical storage means 330 essentially becomes a battery across the current branch 314 and switching means 340 in serial connection. A small current flow is generated from the first end of the electrical storage means, through the current branch 314 from the first end to the second end, through switching means 340 from the emitter to the base, and from the base to the second end of the electrical storage means. This causes base 346 to become more negative that emitter 344 which forward biases switching means 340. This creates a path between connecting means 320 and high negative voltage supply 350. The connecting means 320 with associated circuitry and the connected electrodes are pulled down essentially to the negative potential of supply 350. This negative potential reverse biases diode 360 disconnecting it from ground. The potential difference across the emitter and base of switching means 340 is still generally held by the charge stored in storage means 330.

If the circuit were to remain in this state, electrical storage means 330 would, in time, discharge and switching means 340 would again become biased off. The high negative potential would be stranded on the electrodes. The discharge time of the electrical storage means is chosen to be long compared to the 12 microsecond duration of the strobe signal on line 306. Removal of the strobe signal causes the logic means to forward bias current control means 310. When transistors 310 and 340 are both forward biased, a current flow between voltage supplies 312 and 348 is created. This current quickly biases off transistor 340 via the electrical storage means 330 causing disconnection from high negative supply 350 and forward biases clamping diode means 360 re-establishing the path to ground. The negative potential on the electrodes is quickly removed by the current flow from voltage supply 312.

Thus, the driver reacts very quickly to bring the electrodes to a high potential and return them to a reference potential. Because the high voltage supply 350 is disconnected except when the electrodes are driven to the high potential, electric power is conserved.

Figure 8:
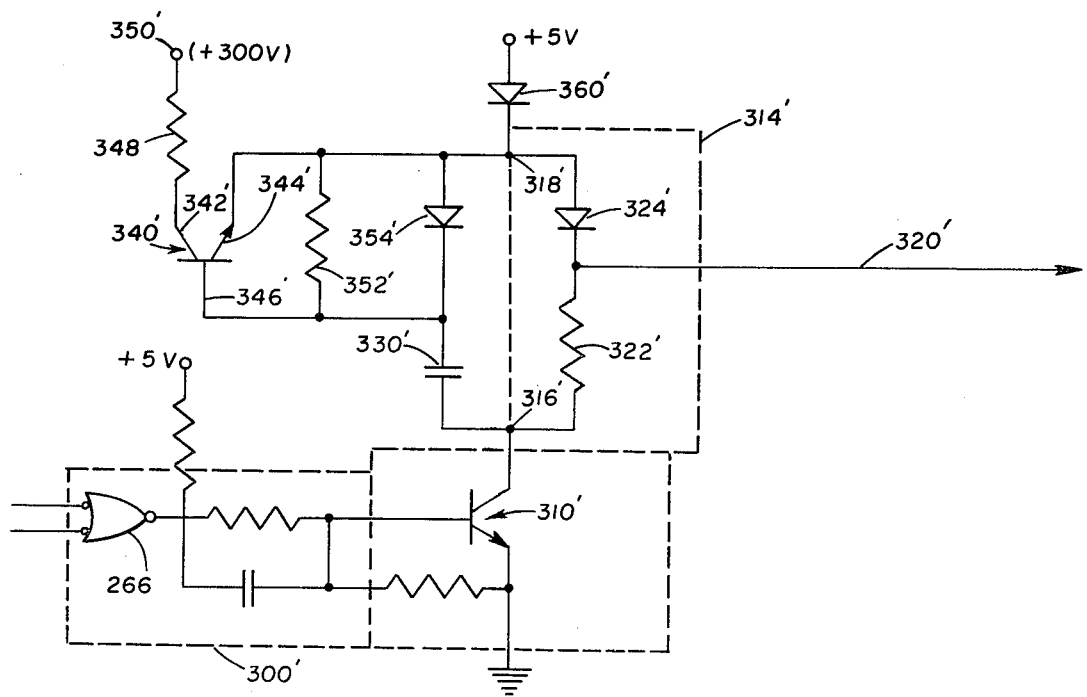
FIG. 8 is a circuit diagram of a complementary electrode driver for use in conjunction with the block diagram of FIG. 6.

FIG. 8 illustrates one of the complementary electrode driver circuits 268. Except for the polarity, the driver of FIG. 8 is essentially the same as the driver of FIG. 7. According, like elements are marked with the same reference numeral as in FIG. 7 followed with a prime ('). The primary areas of difference include replacing pnp transistor 340 with an npn transistor 340'. Diode means 360' is connected between the positive low voltage supply 312' and the second end 318' of current branch 314'. This causes the reference voltage on the electrodes to be generally the potential of low voltage supply 312' less the voltage drop across diodes 324' and 360'. The current control means 310' is connected between the first end 316′ of current branch 314′ and ground. The similarities in circuitry and operation of the driver circuits of FIGS. 7 and 8 are such that reading and understanding the discussion of FIG. 7 provides a full description of FIG. 8.

The invention has been described with reference to the preferred embodiment thereof. Obviously modifications and alterations will occur to others upon the reading and understanding of this specification. Such modifications and alterations are all included within the present invention insofar as they come within the scope of the appended claims or the equivalent thereof.

The invention claimed is:

1. A driver circuit comprising: a current branch having a first end, a second end and an output end; driven circuit connecting means for connecting said current branch with a driven circuit, said driven circuit connecting means connected with said output end of said current branch; electrical storage means having first and second ends with a first end connected with said first end of said current branch; a solid state switching means comprising at least a switch control means for controlling current flow between first and second controlled leads, said switch control means connected with said second end of said electrical storage means, said first controlled lead connected with a high voltage supply and said second controlled lead connected with said second end of said current branch; current control means for controlling current through at least said current branch, said current control means connected with at least said first end of said current branch; and diode means connected with said second end of said current branch for connecting said current branch with a reference potential; wherein said current control means provides a current flow through said current branch, said electrical storage means stores electric energy, said driven circuit connecting means is held near the reference potential, and said solid state switching means is biased off to prohibit current flow between said first and second controlled leads; when said current control means ceases providing a current flow, the electrical storage means forward biases said solid state switching means causing at least said driven circuit connecting means to attain a potential corresponding to the potential of said high voltage supply and causing said diode means to become reverse biased disrupting the connection with the reference potential; and when said current control means next provides current flow through said current path said solid state switching means becomes biased off and said driven circuit connecting means is returned to near said reference potential whereby causing the current control means to interrupt the current flow for a short duration causes a voltage pulse having an amplitude corresponding to the potential of the high voltage supply and a duration substantially the same as the duration of the interruption.

2. The driver circuit as set forth in claim 1 further including second diode means connected between said switch control means and said second controlled lead.

3. The driver circuit as set forth in claim 2 wherein the current branch further comprises a resistive means connected between the first end and said output end of the current branch and a third diode means connected between the second end and said output end of the current branch.

4. The driver circuit as set forth in claim 3 wherein said solid state switching means is a transistor in which said first controlled lead is the collector, said second controlled lead is the emitter and said switch control means is the base.

5. The driver circuit as set forth in claim 4 further including a current limiting resistor between said first controlled lead and said high voltage supply.

6. The driver circuit as set forth in claim 4 wherein said high voltage supply is a positive voltage whereby the driven circuit can be driven to a positive potential and said reference potential is supplied by a low voltage supply connected with said first diode means and wherein said current control means is a second transistor connected between said first end of said current branch and ground.

7. The driver circuit as set forth in claim 4 wherein said high voltage supply is a negative voltage whereby the driven circuit can be driven to a negative potential and further including a low voltage supply having a positive potential, said low voltage supply connected with said current control means and wherein said first diode means connects said second end of the current branch with ground, whereby current flow through the current branch forward biases said first diode means to bring the driven circuit connecting means generally to a ground reference level.

8. The driver circuit as set forth in claim 7 wherein said current control means is a second transistor with its collector and emitter connected between said low voltage supply and said first end of said current branch.

9. The driver circuit as set forth in claim 1 further including logic means for forward and reverse biasing said current control means.

10. The driver circuit as set forth in claim 9 wherein said driven circuit means is at least one electrode for use in conjunction with electrographic recording apparatus.

* * * * *